US008999225B2

(12) United States Patent
Torimoto et al.

(10) Patent No.: US 8,999,225 B2
(45) Date of Patent: Apr. 7, 2015

(54) METHOD FOR PRODUCING HOLLOW NANOPARTICLE COMPRISING DEPOSITION ON/IN AN IONIC LIQUID, HOLLOW NANOPARTICLE, AND DISPERSION LIQUID THEREOF

(75) Inventors: Tsukasa Torimoto, Nagoya (JP); Ken-ichi Okazaki, Nagoya (JP); Toshimasa Suzuki, Gifu (JP); Yousuke Tomita, Nagasaki (JP); Susumu Kuwabata, Ibaraki (JP)

(73) Assignees: National University Corporation Nagoya University, Nagoya (JP); Osaka University, Osaka (JP)

( * ) Notice: Subject to any disclaimer, the term of this patent is extended or adjusted under 35 U.S.C. 154(b) by 350 days.

(21) Appl. No.: 13/508,217

(22) PCT Filed: Nov. 9, 2010

(86) PCT No.: PCT/JP2010/069951
§ 371 (c)(1),
(2), (4) Date: May 4, 2012

(87) PCT Pub. No.: WO2011/058976
PCT Pub. Date: May 19, 2011

(65) Prior Publication Data
US 2012/0219800 A1   Aug. 30, 2012

(30) Foreign Application Priority Data
Nov. 11, 2009   (JP) .................................. 2009-258325

(51) Int. Cl.
*B22F 9/06*   (2006.01)
*B22F 9/16*   (2006.01)
(Continued)

(52) U.S. Cl.
CPC ..... *B81C 99/0045* (2013.01); *B22F 2009/0844* (2013.01); *B01J 13/02* (2013.01);
(Continued)

(58) Field of Classification Search
CPC ................... B22F 2009/06; B22F 2009/0844; B22F 2009/165; B22F 2009/245; B22F 2001/0029; B22F 2201/00; B22F 2201/02; B22F 2201/03; B22F 2201/05; B22F 2201/50; B22F 2301/40
USPC ..................................................... 419/2, 9, 23
See application file for complete search history.

(56) References Cited

U.S. PATENT DOCUMENTS 7,547,347 B2 *   6/2009   Yang et al. ...................... 75/351
8,124,785 B2 *   2/2012   Torimoto et al. .......... 548/335.1
(Continued)

FOREIGN PATENT DOCUMENTS

JP   A-2004-35303     2/2004
JP   A-2004-130429    4/2004
(Continued)

OTHER PUBLICATIONS

Nakamura et al., "Formation of Hollow Oxides via Oxidation of Metallic Nanoparticles," Catalysts & Catalysis, 2007, vol. 49, No. 5, pp. 344-349 (with partial translation).
(Continued)

*Primary Examiner* — Holly Le
(74) *Attorney, Agent, or Firm* — Oliff PLC (57) ABSTRACT

First, an ionic liquid is placed on a glass slide, which is then installed in an evaporation apparatus, and a metal (for example, indium) is mounted as a target material at a position facing the ionic liquid, followed by sputter deposition of the metal. After sputtering, the ionic liquid containing nanoparticles dispersed therein is recovered. The nanoparticles are solid nanoparticles. Next, the ionic liquid containing the solid nanoparticles dispersed therein is placed in a test tube and then oxidized by heating in air at 250° C. for 1 hour. As a result, hollow nanoparticles having cavities formed in core portions of the solid nanoparticles are produced.

3 Claims, 10 Drawing Sheets

(51) Int. Cl.
*B81C 99/00* (2010.01)
*B01J 13/02* (2006.01)
*B01J 31/02* (2006.01)
*B01J 35/00* (2006.01)
*B01J 35/08* (2006.01)
*B01J 37/12* (2006.01)
*B22F 1/00* (2006.01)
*B22F 9/02* (2006.01)
*B82Y 30/00* (2011.01)
*B82Y 40/00* (2011.01)
*C01B 13/32* (2006.01)
*C01G 3/02* (2006.01)
*C01G 15/00* (2006.01)
*C04B 20/00* (2006.01)
*B22F 9/08* (2006.01)

(52) U.S. Cl.
CPC ......... *B01J 31/0278* (2013.01); *B01J 35/0013* (2013.01); *B01J 35/08* (2013.01); *B01J 37/12* (2013.01); *B22F 1/0018* (2013.01); *B22F 1/0051* (2013.01); *B22F 9/02* (2013.01); *B81B 2201/0235* (2013.01); *B82Y 30/00* (2013.01); *B82Y 40/00* (2013.01); *C01B 13/322* (2013.01); *C01G 3/02* (2013.01); *C01G 15/00* (2013.01); *C01P 2002/72* (2013.01); *C01P 2002/82* (2013.01); *C01P 2002/84* (2013.01); *C01P 2004/04* (2013.01); *C01P 2004/34* (2013.01); *C01P 2004/52* (2013.01); *C01P 2004/64* (2013.01); *C04B 20/0036* (2013.01)

(56) References Cited

U.S. PATENT DOCUMENTS

| 8,460,427 B2* | 6/2013 | Tsai et al. ............... 75/371 |
| 2008/0245186 A1* | 10/2008 | Yang et al. ............... 75/362 |
| 2009/0035575 A1* | 2/2009 | Tsai et al. ............... 428/402 |
| 2009/0306394 A1 | 12/2009 | Torimoto et al. |
| 2012/0156088 A1* | 6/2012 | Andre et al. ............... 420/466 |

FOREIGN PATENT DOCUMENTS

| JP | A-2005-74552 | 3/2005 |
| JP | A-2006-224036 | 8/2006 |
| JP | A-2007-105873 | 4/2007 |
| JP | A-2007-111855 | 5/2007 |
| JP | A-2007-231306 | 9/2007 |
| JP | A-2009-525396 | 7/2009 |
| WO | WO 2007/084558 A2 | 7/2007 |
| WO | WO 2009/064964 A2 | 5/2009 |

OTHER PUBLICATIONS

Yin et al., "Formation of Hollow Nanocrystals Through the Nanoscale Kirkendall Effect," Science, 2004, vol. 304, pp. 711-714.

International Search Report issued in International Patent Application No. PCT/JP2010/069951 dated Dec. 14, 2010.

International Preliminary Report on Patentability issued in International Patent Application No. PCT/JP2010/069951 dated Jun. 12, 2012.

* cited by examiner

METHOD FOR PRODUCING HOLLOW NANOPARTICLE COMPRISING DEPOSITION ON/IN AN IONIC LIQUID, HOLLOW NANOPARTICLE, AND DISPERSION LIQUID THEREOF

TECHNICAL FIELD

The present invention relates to a method for producing hollow nanoparticles, hollow nanoparticles, and a dispersion liquid thereof.

BACKGROUND ART

Hollow particles of metal oxides are expected to contribute to improvement in catalytic functions and the realization of a new function. For example, Patent Document 1 discloses that hollow particles of titanium oxide are produced by adding a toluene solution of titanium butoxide to an ionic liquid and vigorously stirring the resultant mixture. This is described as follows: The titanium oxide hollow particles are formed by sol-gel reaction of the titanium butoxide due to a trace amount of water in the ionic liquid at the interfaces of toluene microdroplets formed in the ionic liquid. In addition, Patent Document 2 discloses a method for producing a hollow oxide shell structure by alternately adsorbing a nano-sheet of layered oxide and a cationic polymer in a liquid phase on a polymer sphere to form a multilayer thin film including the nano-sheet and the cationic polymer on the polymer sphere, and then removing the polymer sphere. On the other hand, Non-Patent Document 1 reports that as a result of TEM (Transmission Electron Microscope) observation of a change in shape of Cu nanoparticles after oxidation at room temperature to 400° C., hollow nanoparticles were formed by oxidation.

Patent Document 1: JP 2004-035303 A
Patent Document 2: JP 2004-130429 A
Non-Patent Document 1: Catalyst, Vol. 49, No. 5, 2007, pp. 344-349

DISCLOSURE OF INVENTION

However, the hollow particles of the above-described Patent Documents 1 and 2 have particle diameters on the micrometer order, and hollow particles with nanometer-order sizes are not produced. In addition, the hollow nanoparticles of Non-Patent Document 1 have a nanometer-order size, but the nanoparticles are formed to adhere to a substrate by vacuum vapor deposition, thereby requiring much time for separating the particles from the substrate and dispersing them in a liquid and possibly causing aggregation of the particles in the liquid during dispersion.

The present invention has been achieved for resolving the above-described problem, and a main object is to easily produce hollow nanoparticles dispersed in a liquid.

In order to achieve the object, as a result of heating in air an ionic liquid containing indium nanoparticles prepared by sputter-deposition of indium to the ionic liquid, the inventors found that indium oxide nanoparticles having a hollow structure are produced, leading to the completion of the present invention.

According to a first embodiment of the present invention, a method for producing hollow nanoparticles includes:

(a) a step of depositing a predetermined metal to an ionic liquid to prepare the ionic liquid containing solid nanoparticles of the metal dispersed therein; and (b) a step of oxidizing the ionic liquid containing the solid nanoparticles dispersed therein in a gas atmosphere containing oxidizing gas to produce hollow nanoparticles having cavities formed in core portions of the solid nanoparticles.

According to a second embodiment of the present invention, a method for producing hollow nanoparticles includes:

(a) a step of depositing a first metal and a second metal which is less oxidizable than the first metal to an ionic liquid to prepare the ionic liquid containing solid nanoparticles of an alloy dispersed therein, the alloy being composed of the first and second metals; and (b) a step of oxidizing the ionic liquid containing the solid nanoparticles dispersed therein in a gas atmosphere containing oxidizing gas to produce hollow nanoparticles having a jingle-bell-shaped structure in which cavities are formed in core portions of the solid nanoparticles, and particles of the second metal remain in the cavities.

In the method for producing hollow nanoparticles according to the first embodiment of the present invention, hollow nanoparticles dispersed in an ionic liquid with little aggregation of the particles can be produced according to simple procedures including vapor-deposition of a metal to the ionic liquid and then oxidation of the metal. The resultant hollow nanoparticles have the inner cavities and thus can be expected to store and transport a material by using the cavities and can be expected to be utilized in various fields because the physical and chemical properties are different from those of solid nanoparticles.

In the method for producing hollow nanoparticles according to the second embodiment of the present invention, hollow nanoparticles dispersed in an ionic liquid with little aggregation of the particles can be produced according to simple procedures including vapor-deposition of a first metal and a second metal which is less oxidizable than the first metal to an ionic liquid and then oxidation of the metal. The resultant hollow nanoparticles have particles of the second metal present in the cavities thereof and thus are referred to as "having a jingle-bell-shaped structure". Since the resultant hollow nanoparticles contain the second metal particles in the inner cavities thereof, development of a novel reaction using the second metal particles as a catalyst can be expected, and utilization in various fields can be expected because the physical and chemical properties are different from those of solid nanoparticles. Vapor deposition of the first metal and the second metal to the ionic liquid may be simultaneously or sequentially performed.

BEST MODE FOR CARRYING OUT THE INVENTION

In a method for producing hollow nanoparticles according to a first embodiment of the present invention, examples of a predetermined metal include Al, Cr, Co, In, Cu, Sn, Ti, Ga, Mo, W, Si, Mg, V, Mn, Fe, Ni, Zn, Ge, Nb, Ta, and the like. Among these metals, Al, Cr, Co, In, Cu, Sn, Ti, Ga, Mo, and W are preferred, and Al, Cr, Co, In, Cu, and Sn are particularly preferred. These metals are preferred because they have the property that in the state of solid nanoparticles, very thin metal oxide films are formed only on the surfaces of the nanoparticles. In a method for producing hollow nanoparticles in a second embodiment of the present invention, examples of a first metal include Al, Cr, Co, In, Cu, Sn, Ti, Ga, Mo, W, Si, Mg, V, Mn, Fe, Ni, Zn, Ge, Nb, Ta, and the like. Among these metals, Al, Cr, Co, In, Cu, Sn, Ti, Ga, Mo, and W are preferred, and Al, Cr, Co, In, Cu, and Sn are particularly preferred. Examples of a second metal which is less oxidizable than the first metal include Au, Pt, Pd, Rh, Ru, Ir, and the like.

Each of the methods for producing hollow nanoparticles according to the first and second embodiments of the present invention uses an ionic liquid. The term "ionic liquid" represents a series of compounds which are liquid at normal temperature in spite of being salts composed of cation and anion alone. The ionic liquid has the properties of high-temperature stability and a wide range of liquid temperatures, substantially zero vapor pressure, low viscosity in spite of being ionic, high oxidation-reduction resistance, etc. The ionic liquid which can be applied to the present invention may be either hydrophilic or hydrophobic, and examples of types thereof include, but are not particularly limited to, aliphatic ionic liquids, imidazolium-based ionic liquids, pyridinium-based ionic liquids, and the like. Examples of the aliphatic ionic liquids include N,N,N-trimethyl-N-propylammonium bis(trifluoromethanesulfonyl)imide, N-methyl-N-propylpiperidinium bis(trifluoromethanesulfonyl)imide, N,N-diethyl-N-methyl-N-(2-methoxyethyl)ammonium bis(trifluoromethanesulfonyl)imide, N,N-diethyl-N-methyl-N-(2-methoxyethyl)ammonium tetrafluoroborate, and the like. Examples of the imidazolium-based ionic liquids include 1,3-dialkylimidazolium salts, 1,2,3-trialkylimidazolium salts, and the like. Specific examples of the 1,3-dialkylimidazolium salts include 1-ethyl-3-methylimidazolium bromide, 1-ethyl-3-methylimidazolium chloride, 1-ethyl-3-methylimidazolium (L)-lactate, 1-ethyl-3-methylimidazolium hexafluorophosphate, 1-ethyl-3-methylimidazolium tetrafluoroborate, 1-butyl-3-methylimidazolium chloride, 1-butyl-3-methylimidazolium hexafluorophosphate, 1-butyl-3-methylimidazolium tetrafluoroborate, 1-butyl-3-methylimidazolium trifluoromethanesulfonate, 1-butyl-3-methylimidazolium (L)-lactate, 1-hexyl-3-methylimidazolium bromide, 1-hexyl-3-methylimidazolium chloride, 1-hexyl-3-methylimidazolium hexafluorophosphate, 1-hexyl-3-methylimidazolium tetrafluoroborate, 1-hexyl-3-methylimidazolium trifluoromethanesulfonate, 1-octyl-3-methylimidazolium chloride, 1-octyl-3-methylimidazolium hexafluorophosphate, 1-decyl-3-methylimidazolium chloride, 1-dodecyl-3-methylimidazolium chloride, 1-tetradecyl-3-methylimidazolium chloride, 1-hexadecyl-3-methylimidazolium chloride, 1-octadecyl-3-methylimidazolium chloride, and the like. Examples of the 1,2,3-trialkylimidazolium salts include 1-ethyl-2,3-dimethylimidazolium bromide, 1-ethyl-2,3-dimethylimidazolium chloride, 1-butyl-2,3-dimethylimidazolium bromide, 1-butyl-2,3-dimethylimidazolium chloride, 1-butyl-2,3-dimethylimidazolium tetrafluoroborate, 1-butyl-2,3-dimethylimidazolium trifluoromethanesulfonate, 1-hexyl-2,3-dimethylimidazolium bromide, 1-hexyl-2,3-dimethylimidazolium chloride, 1-hexyl-2,3-dimethylimidazolium tetrafluoroborate, 1-hexyl-2,3-dimethylimidazolium trifluoromethanesulfonate, and the like. Other imidazolium salts include 1-allyl-3-methylimidazolium tetrafluoroborate, 1-allyl-3-ethylimidazolium tetrafluoroborate, and the like. The pyridinium-based ionic liquids include ethylpyridinium salts, butylpyridinium salts, hexylpyridinium salts, and the like. Specific examples of the ethylpyridinium salts include 1-ethylpyridinium bromide, 1-ethylpyridinium chloride, and the like. Specific examples of the butylpyridinium salts include 1-butylpyridinium bromide, 1-butylpyridinium chloride, 1-butylpyridinium hexafluorophosphate, 1-butylpyridinium tetrafluoroborate, 1-butylpyridinium trifluoromethanesulfonate, and the like. Examples of the hexylpyridinium salts include 1-hexylpyridinium bromide, 1-hexylpyridinium chloride, 1-hexylpyridinium hexafluorophosphate, 1-hexylpyridinium tetrafluoroborate, 1-hexylpyridinium trifluoromethanesulfonate, and the like.

In each of the methods for producing hollow nanoparticles according to the first and second embodiments of the present invention, in a step (a), vapor deposition can be performed by the same apparatus and procedures as for depositing solid nanoparticles on a substrate by a dry deposition method such as a known chemical vapor deposition method (CVD method) or physical vapor deposition method (PVD method). Among these methods, the physical vapor deposition method (e.g., a vacuum deposition method, an ion plating method, a sputtering method, or the like) in which metal atoms are generated by evaporation from a solid-state metal is preferred. The physical vapor deposition method can produce solid nanoparticles directly from a bulk material in a relatively simple system. In addition, as the physical vapor deposition method, the sputtering method is more preferred. The sputtering method can produce solid nanoparticles with high purity because of no need for a crucible for evaporating a metal. With respect to an evaporation principle, in the case of the vacuum deposition method, for example, a resistance heating method, a far-infrared heating method, an electron beam heating method, an arc heating method, a high-frequency induction heating method, and the like can be used. In the case of the ion plating method, for example, a high-frequency excitation method, an ion beam method, a cluster method, and the like can be used. In the case of the sputtering method, for example, a DC sputtering method, a magnetron sputtering method, a high-frequency sputtering method, an ion beam sputtering method, and the like can be used.

In each of the methods for producing hollow nanoparticles according to the first and second embodiments of the present invention, the step (a) is preferably performed under reduced pressure. Under reduced pressure, solid nanoparticles with high purity can be produced within a short time. The "reduced pressure" may be pressure lower than the atmospheric pressure, preferably 20 Pa or less. When solid nanoparticles are produced by the sputtering method, the sputtering method may be performed in a gas atmosphere. When gas is introduced, the gas used is preferably rare gas and more preferably argon gas. The pressure of the argon gas is preferably 20 Pa or less. The deposition current may be properly determined according to the raw material and deposition apparatus used. In addition, the preferred range of the reaction time varies with reaction temperature and the amount of the ionic liquid, but the reaction time is preferably determined in the range of several tens seconds to several hours, more preferably in the range of 30 seconds to 20 minutes.

Figure 1:
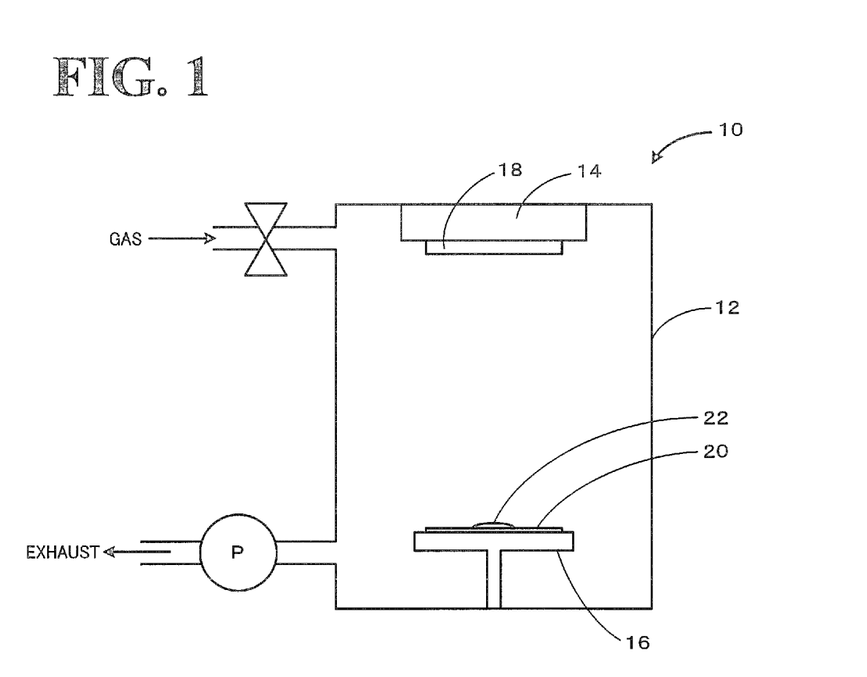
FIG. 1 is an explanatory view illustrating a schematic configuration of a vapor deposition apparatus 10.

When solid nanoparticles are produced by the sputtering method, for example, the following method may be used. As shown in FIG. 1, when the deposition apparatus 10 used is provided with a deposition chamber 12 which can be evacuated, a cathode 14 which is installed on the top of the deposition chamber 12 and on which a target material 18 can be mounted, and an anode 16 installed opposite to the cathode 14, first the target material 18 is mounted on the cathode 14, and a glass substrate 20 on which an ionic liquid 22 is placed is set on the anode 16. Then, in the deposition chamber 12 in which a vacuum or gas atmosphere (for example, argon gas) state is created, a high voltage is applied to the cathode 14. As a result, glow discharge occurs in the deposition chamber 12, and gas ions produced by the glow discharge collide with the target material 18, thereby sputter-evaporating a metal constituting the target material 18. The metal ejected from the target material 18 adheres to the ionic liquid 22 facing the target, thereby producing solid nanoparticles of the metal on the ionic liquid 22 or in the ionic liquid 22.

In each of the methods for producing hollow nanoparticles in the first and second embodiments of the present invention, the particle diameter of the solid nanoparticles produced in the step (a) can be changed according to the type of the ionic liquid used. In addition, the particle diameter of the solid nanoparticles produced in the step (a) can be changed according to the deposition time. Specifically, the particle diameter of the solid nanoparticles increases as the reaction time increases, and when the particles reaches a predetermined size, growth of particles tends to be stopped. Therefore, solid nanoparticles having an intended particle diameter can be produced by changing the ionic liquid or the reaction time. Since the particle diameter of hollow nanoparticles produced in the step (b) is determined depending on the particle diameter of the solid nanoparticles produced in the step (a), the particle diameter of the hollow nanoparticles can be controlled by changing the type of the ionic liquid used in the step (a) or the deposition time in the step (a).

In each of the methods for producing hollow nanoparticles in the first and second embodiments of the present invention, oxidizing gas used in the step (b) is not particularly limited as long as it has the ability to oxidize a metal, but, for example, oxygen gas and air can be used. When oxidation is performed by heating in air in the step (b), the heating temperature is not particularly limited as long as it permits oxidation of the metal constituting the hollow particles with the oxidizing gas, but is, for example, 100° C. to 400° C. and preferably 200° C. to 300° C. The heating time is not particularly limited as long as it permits oxidation of the metal constituting the hollow particles with the oxidizing gas, but is, for example, several minutes to several hours.

The hollow nanoparticles produced in each of the methods for producing hollow nanoparticles in the first and second embodiments of the present invention can be recovered from the ionic liquid by adding to the ionic liquid a solvent having high affinity for the ionic liquid. That is, by adding, to the ionic liquid, a solvent having high affinity for the ionic liquid, the hollow nanoparticles in the ionic liquid are precipitated. In this way, the hollow nanoparticles can be recovered from the ionic liquid with no need for a complicated operation. For example, when the ionic liquid used is hydrophilic, water, methanol, ethanol, acetone, and the like can be used as the solvent having high affinity for the ionic liquid, while when the ionic liquid used is hydrophobic, ether, heptane, chloroform, methylene chloride, and the like can be used as the solvent having high affinity for the ionic liquid.

Each of the methods for producing hollow nanoparticles in the first and second embodiments of the present invention may be performed in one step, not divided into two steps, i.e., the step (a) and the step (b). Specifically, in the method for producing hollow nanoparticles in the first embodiment of the present invention, the predetermined metal may be deposited to the ionic liquid in the gas atmosphere containing oxidizing gas so that hollow nanoparticles having cavities formed in core portions of the solid nanoparticles of the metal are produced in one step in the ionic liquid. For example, the ionic liquid containing the hollow nanoparticles dispersed therein can be produced by vapor deposition of the predetermined metal (e.g., Al, Cr, Co, In, Cu, Sn, Ti, Ga, Mo, W, Si, Mg, V, Mn, Fe, Ni, Zn, Ge, Nb, Ta, or the like) to the ionic liquid under reduced pressure in a low-purity rare gas atmosphere (containing oxygen gas as an impurity).

In the method for producing hollow nanoparticles in the first embodiment of the present invention, the solid nanoparticles produced in the step (a) may be solid nanoparticles having a two-layer structure in which when each of the nanoparticles is divided into a spherical core portion and a shell portion (outer coat portion) which covers the core portion, the predetermined metal is present in the core portion, and an oxide of the metal is present in the shell portion. For example, vapor deposition of Al, Cr, Co, In, Cu, Sn, Ti, Ga, Mo, W, Si, Mg, V, Mn, Fe, Ni, Zn, Ge, Nb, or Ta to the ionic liquid easily produces solid nanoparticles having such a two-layer structure. In this case, the oxide of the metal present in the shell portion is considered to be formed with the oxygen gas serving as an oxygen source. When the hollow nanoparticles are produced by oxidizing the solid nanoparticles having the two-layer structure, the core portions of the solid nanoparticles are made hollow by oxidation of the metal, while the metal oxide in the shell portions is not changed because it has been already oxidized. That is, the size of the solid nanoparticles produced in the step (a) remains substantially the same in the hollow nanoparticles produced in the step (b). Therefore, the size of the hollow nanoparticles can be controlled by controlling the size of the solid nanoparticles.

The hollow nanoparticles of the present invention include shells composed of the metal oxide and have a spherical shape having an average particle diameter of over 4 nm and 50 nm or less. The hollow nanoparticles can be produced by, for example, the method for producing hollow nanoparticles according to the first embodiment of the present invention. According to the method, the thickness of the shells is about 2 nm regardless of the average particle diameter. In addition, the average particle diameter can be controlled within the range of over 4 nm and 50 nm or less by changing the type of the ionic liquid used in the method for producing hollow nanoparticles according to the first embodiment of the present invention. For example, the hollow nanoparticles composed of indium oxide can be adjusted in the range of 6 to 18 nm (refer to Examples 1 to 6 described below). Since the hollow nanoparticles of Non-Patent Document 1 have a distorted shape, not a spherical shape, because they are not produced in a liquid. In Patent Documents 1 and 2, the spherical hollow particles composed of an inorganic oxide are produced, but the hollow particles are not nanoparticles because of the particle diameter of 1 to 100 μm.

The hollow nanoparticles of the present invention may include, in the cavities thereof, a metal which is less oxidizable than the metal constituting the metal oxide of the shells. These hollow nanoparticles can be produced by, for example, the method for producing hollow nanoparticles according to the second embodiment of the present invention.

A hollow nanoparticle-dispersed liquid of the present invention is prepared by dispersing the hollow nanoparticles of the present invention in an ionic liquid. The dispersion liquid is easy to handle and thus has high convenience as compared with the hollow nanoparticles.

EXAMPLES

Preferred examples of the present invention are described in detail below. Examples 1 to 6 are examples in which hollow nanoparticles were produced in two steps using indium, Example 7 is an example in which hollow nanoparticles were produced in two steps using copper, Example 8 is an example in which hollow nanoparticles having a jingle-bell-shaped structure were produced in two steps using gold and indium, and Example 9 is an example in which hollow nanoparticles were produced in one step using indium.

Example 1

(1) Production of Solid Nanoparticles

EMI-BF4 (1-ethyl-3-methylimidazolium tetrafluoroborate) was dried at 120° C. for 3 hours under reduced pressure. After drying, 0.60 cm$^3$ of EMI-BF4 was uniformly placed on a glass slide (26 mm×38 mm). In this case, surface tension prevented the EMI-BF4 from running over from the glass substrate. The glass substrate was installed in a deposition apparatus (SC701-HMCII manufactured by Sanyu Electron Co., Ltd.), and indium (disk shape, diameter 49 mm×thickness 1.0 mm) was mounted as a target material at a position facing the EMI-BF4, followed by sputter deposition of indium (distance between the target and the ionic liquid: 2.0 cm, inside the deposition chamber: high-purity argon (purity 99.995%), pressure: 2.0 Pa, deposition current: 10 mA, reaction time: 10 minutes). After sputtering, an EMT-BF4 solution, i.e., an ionic liquid containing nanoparticles dispersed therein, was recovered from the surface of the glass slide.

(2) Structural Analysis of Solid Nanoparticles

Figure 2:
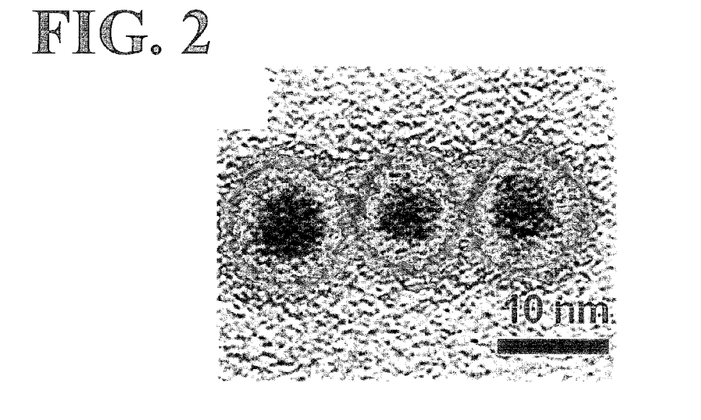
FIG. 2 is a photograph showing a TEM image of solid nanoparticles of Example 1.
Figure 3:
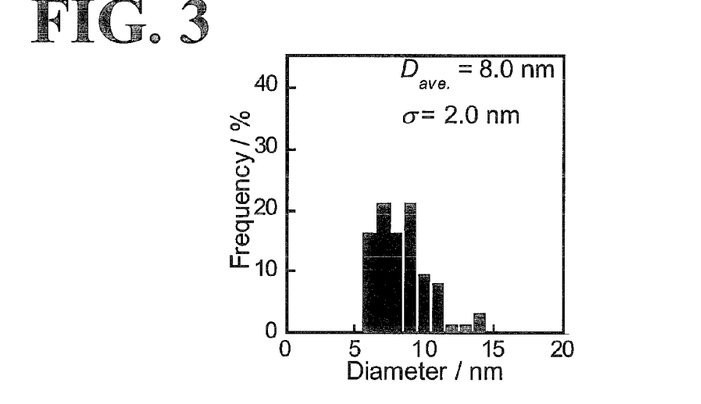
FIG. 3 is a graph showing a particle size distribution of solid particles of Example 1.
Figure 4:
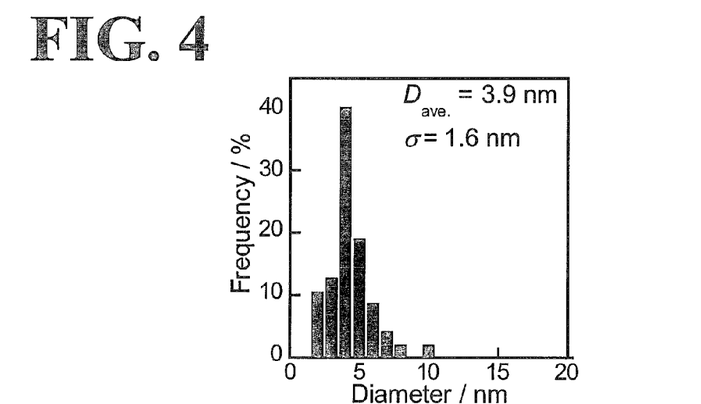
FIG. 4 is a graph showing a core size distribution of solid nanoparticles of Example 1.
Figure 5:
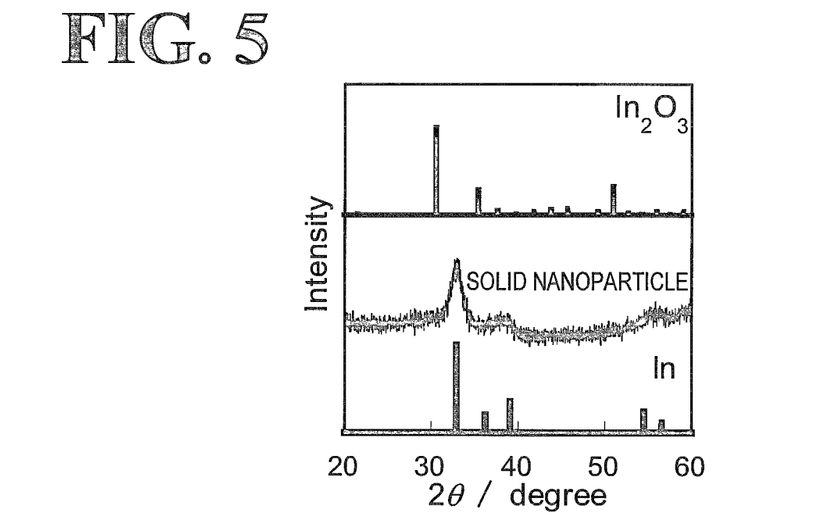
FIG. 5 is a graph showing the XRD results of solid nanoparticles of Example 1.
Figure 6:
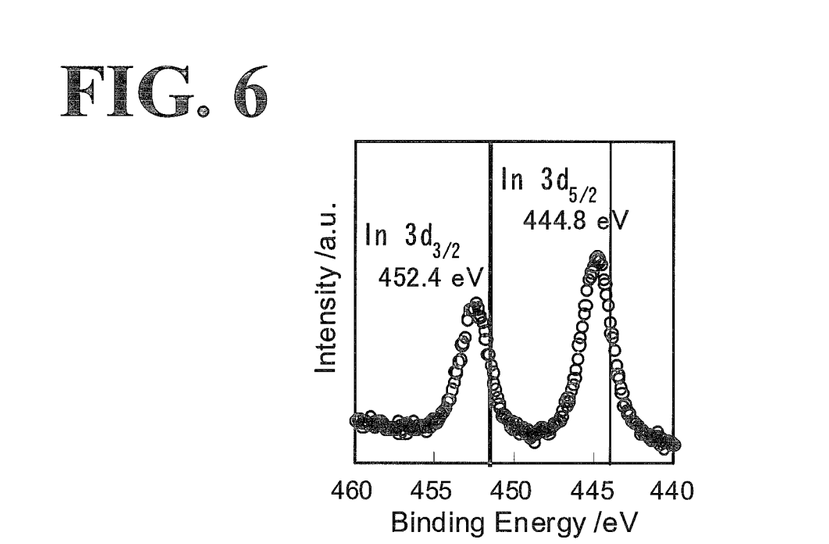
FIG. 6 is a graph showing the XPS results of solid nanoparticles of Example 1.

FIG. 2 shows a TEM image of the nanoparticles dispersed in the ionic liquid, FIG. 3 shows a particle size distribution, and FIG. 4 shows a core size distribution. The TEM image was obtained by observation with a transmission electron microscope (manufactured by Hitachi High-Technologies Co., Ltd., model H7650). In this case, a commercial Cu grid with a carbon support film (STEM100 Cu grid manufactured by Okenshoji Co., Ltd.) was used as a TEM grid, and a measurement sample was prepared by dropping, on the TEM grid, the ionic liquid after sputtering and then removing an excess of the ionic liquid with filter paper. Therefore, the nanoparticles on the TEM grid are considered to be isolated from the ionic liquid. The nanoparticles shown in FIG. 2 have a core-shell structure including a shell shown in light gray and a core particle shown in dark gray and present in the shell, and cavities are not observed in the nanoparticles. This reveals that the nanoparticles are solid nanoparticles. In addition, FIGS. 3 and 4 indicate that the solid nanoparticles have an average particle diameter of about 8 nm, a core size of about 4 nm, and a shell thickness of about 2 nm. The solid nanoparticles were analyzed by XRD (X-ray diffraction) and XPS (X-ray photoelectron spectroscopy). The results are shown in FIGS. 5 and 6. In an XRD pattern shown in FIG. 5, only peaks corresponding to indium metal crystals are observed, but peaks corresponding to indium oxide are not observed. In an XPS pattern shown in FIG. 6, a peak corresponding to indium oxide, not metal indium, is observed at the surfaces of the particles. It is confirmed from the results shown in FIGS. 5 and 6 that the solid nanoparticles have a core-shell structure including a core portion in which metal indium is present, and a shell portion in which amorphous indium oxide is present. In addition, an oxygen source of indium oxide in the shell portion is considered to be a trace amount of oxygen gas present as impurities in the argon gas.

(3) Production of Hollow Nanoparticles

In a test tube, 0.1 cm$^3$ of the ionic liquid containing the solid nanoparticles dispersed therein and produced in above (1) was placed and heated in air at 250° C. for 1 hour.

(4) Structural Analysis of Hollow Nanoparticles

Figure 7:
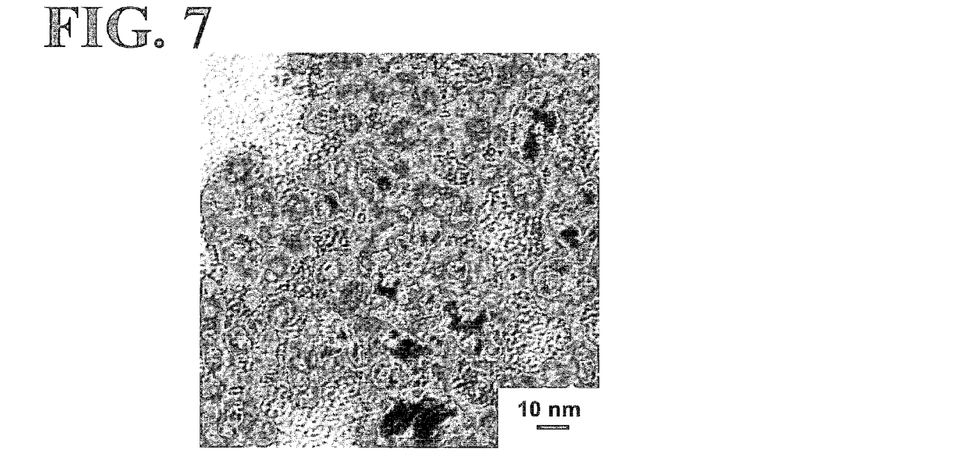
FIG. 7 is a photograph showing a TEM image of hollow nanoparticles of Example 1.
Figure 8:
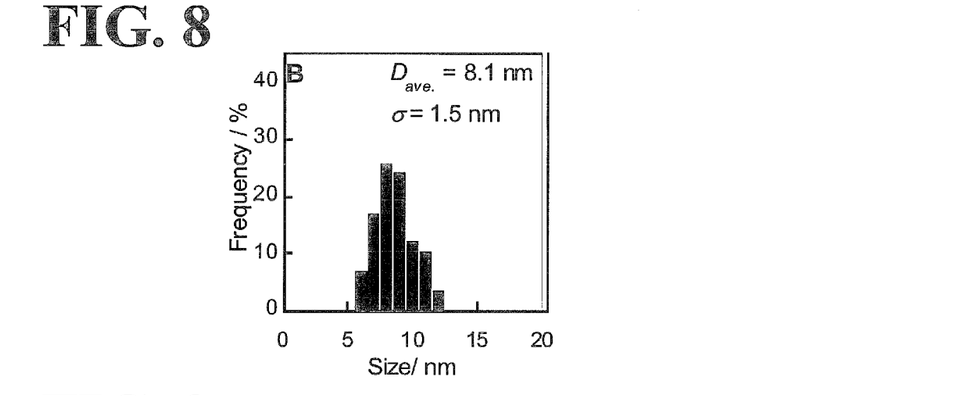
FIG. 8 is a graph showing a particle size distribution of hollow nanoparticles of Example 1.
Figure 9:
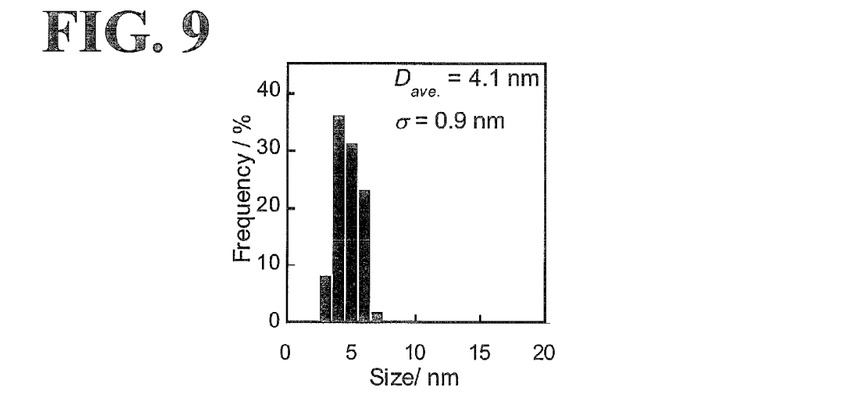
FIG. 9 is a graph showing a void size distribution of hollow nanoparticles of Example 1.
Figure 10:
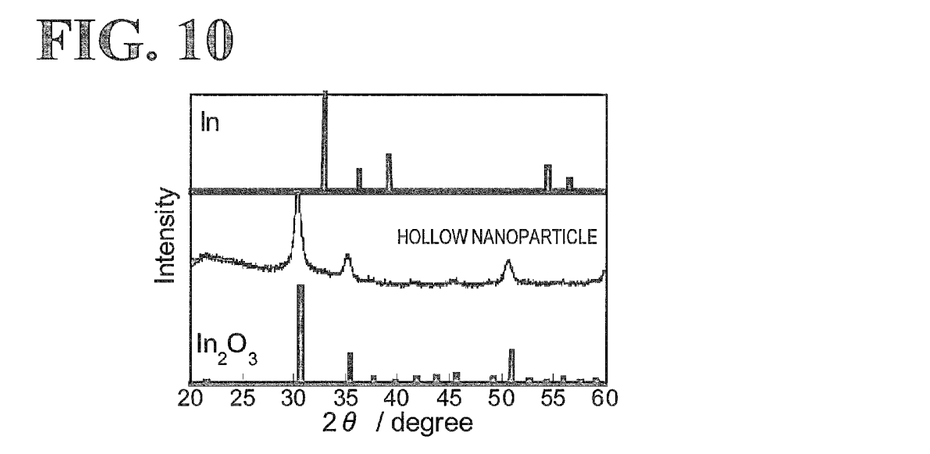
FIG. 10 is a graph showing the XRD results of hollow nanoparticles of Example 1.
Figure 11:
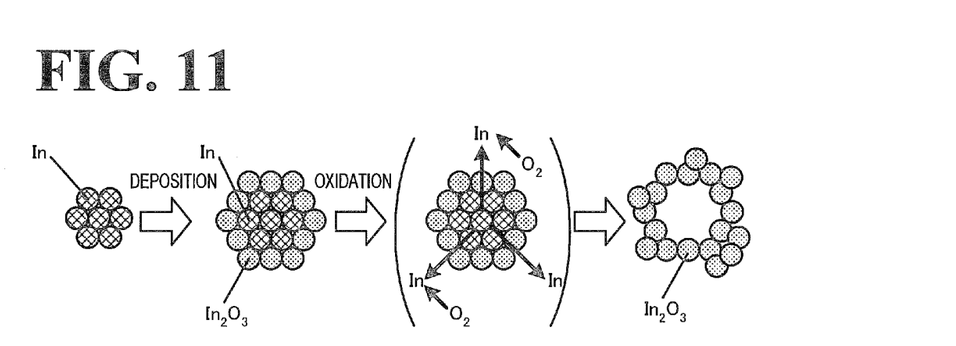
FIG. 11 is an explanatory view illustrating a production mechanism of hollow nanoparticles of Example 1.

FIG. 7 shows a TEM image of the nanoparticles dispersed in the ionic liquid after heating in air, FIG. 8 shows a particle size distribution, and FIG. 9 shows a void size distribution in the particles. The nanoparticles shown in FIG. 7 each have a circle shown in light gray and a ring shown in dark gray around the circle, and thus it is found that the nanoparticles are hollow nanoparticles which are hollow inside. In addition, FIGS. 8 and 9 indicate that the hollow nanoparticles have an average particle diameter of about 8 nm, a void size of about 4 nm, and a shell thickness of about 2 nm. The hollow nanoparticles were analyzed by XRD. The results are shown in FIG. 10. In an XRD pattern shown in FIG. 10, only peaks corresponding to indium oxide crystals are observed. This reveals that the hollow nanoparticles are hollow nanoparticles of indium oxide with high crystallinity. A conceivable production mechanism of the hollow nanoparticles is that as shown in FIG. 11, when solid nanoparticles each having a core portion composed of indium metal and a shell portion composed of indium oxide are heated in air, oxygen gas in the air reacts with indium metal in the core portions through micro-spaces in the shell portions, thereby producing indium oxide and forming cavities in the core portions.

Examples 2 to 6

In Examples 2 to 6, solid nanoparticles were produced using other ionic liquids in place of the ionic liquid EMI-BF4 used in Example 1. Specifically, BMMI-BF4 (1-butyl-2,3-dimethylimidazolium tetrafluoroborate) was used in Example 2, BMI-PF6 (1-butyl-3-methylimidazolium hexafluorophosphate) was used in Example 3, BMI-BF4 (1-butyl-3-methylimidazolium tetrafluoroborate) was used in Example 4, AMI-BF4 (1-allyl-3-methylimidazolium tetrafluoroborate) was used in Example 5, and AEI-BF4 (1-allyl-3-ethylimidazolium tetrafluoroborate) was used in Example 6. As a result, the resultant solid nanoparticles had a particle diameter of about 6 nm in Example 2, a particle diameter of about 7 nm in Example 3, a particle diameter of about 10 nm in Example 4, a particle diameter of about 16 nm in Example 5, and a particle diameter of about 18 nm in Example 6. In any one of the examples, the shell thickness was about 2 nm. In addition, the solid nanoparticles in each of the examples were heated at 250° C. for 1 hour in air in the same manner as in Example 1, thereby producing hollow nanoparticles having substantially the same particle diameter as the original solid nanoparticles.

Example 7

(1) Production of Solid Nanoparticles

On the same glass slide as in Example 1, 0.60 cm$^3$ of dried EMI-BF4 was uniformly placed. This glass slide was installed in the same deposition apparatus as in Example 1, and copper (disk shape, diameter 49 mm×thickness 0.5 mm) was mounted as a target material at a position facing the EMI-BF4, followed by sputter deposition of copper (distance between the target and the ionic liquid: 2.0 cm, inside the deposition chamber: high-purity argon, pressure: 2.0 Pa, deposition current: 40 mA, reaction time: 10 minutes). After sputtering, an EMI-BF4 solution, i.e., an ionic liquid containing nanoparticles dispersed therein, was recovered from the surface of the slide glass.

(2) Structural Analysis of Solid Nanoparticles

Figure 12:
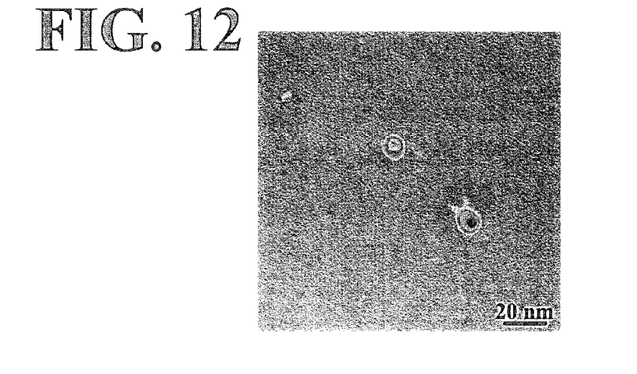
FIG. 12 is a photograph showing a TEM image of solid nanoparticles of Example 7.
Figure 13:
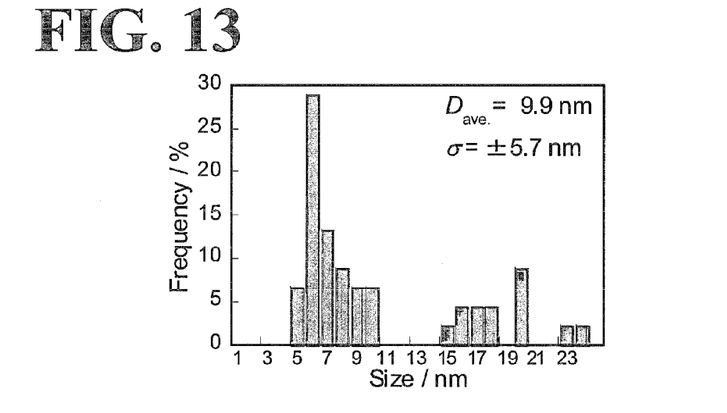
FIG. 13 is a graph showing a particle size distribution of solid nanoparticles of Example 7.

FIG. 12 shows a TEM image of the nanoparticles dispersed in the ionic liquid, and FIG. 13 shows a particle size distribution.

Figure 14:
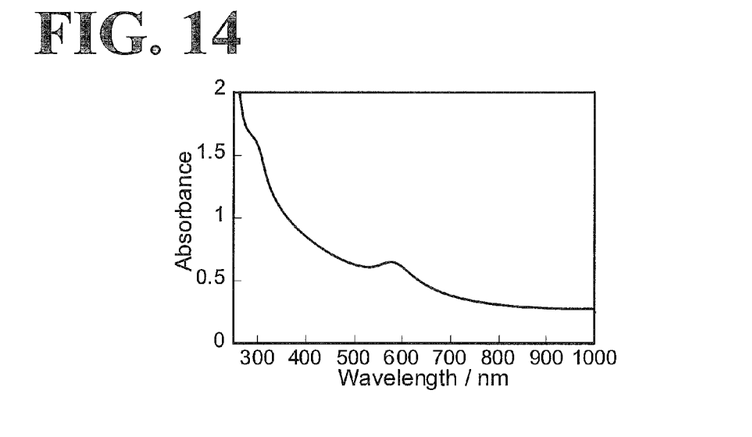
FIG. 14 is a graph showing an absorption spectrum of solid nanoparticles of Example 7.

In FIG. 12, the nanoparticles are shown as gray circles with a uniform color density. This reveals that the nanoparticles are solid nanoparticles. In addition, FIG. 13 indicates that the solid nanoparticles have an average particle diameter of about 10 nm. Further, FIG. 14 shows an absorption spectrum of the ionic liquid after sputter deposition. A peak considered to be due to surface plasmon resonance of Cu nanoparticles is observed near 580 nm. This suggests that copper oxide is absent from the surfaces of the solid nanoparticles or is present as very thin layers on the surfaces of the solid nanoparticles.

(3) Production of Hollow Nanoparticles

In a test tube, 0.1 cm$^3$ of the ionic liquid containing the solid nanoparticles dispersed therein and produced as described above in (1) was placed and heated in air at 250° C. for 1 hour.

(4) Structural Analysis of Hollow Nanoparticles

Figure 15:
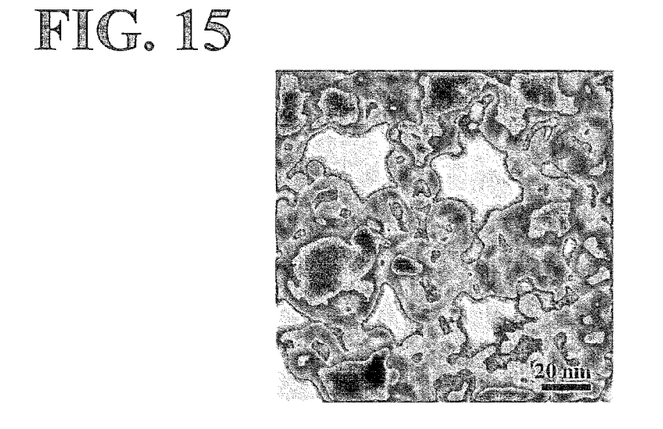
FIG. 15 is a photograph showing a TEM image of hollow nanoparticles of Example 7.
Figure 16:
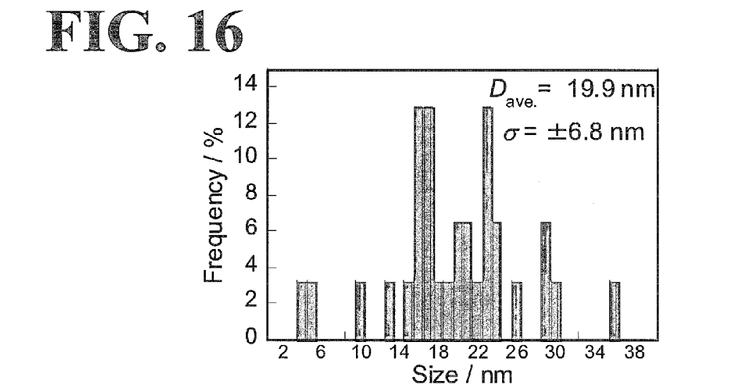
FIG. 16 is a graph showing a particle size distribution of hollow nanoparticles of Example 7.
Figure 17:
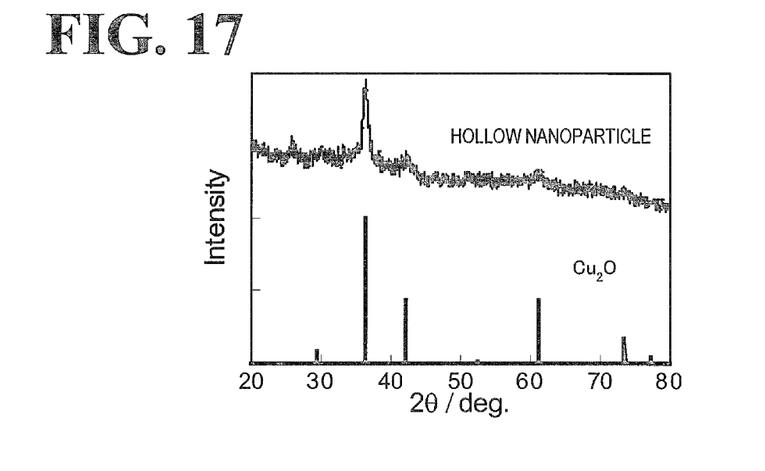
FIG. 17 is a graph showing the XRD results of hollow nanoparticles of Example 7.

FIG. 15 shows a TEM image of the nanoparticles dispersed in the ionic liquid after heating in air, and FIG. 16 shows a particle size distribution of the nanoparticles. The nanoparticles shown in FIG. 15 each have a circle shown in light gray and a ring shown in dark gray around the circle, and thus it is found that the nanoparticles are hollow nanoparticles. In addition, FIG. 15 indicates that the hollow nanoparticles have a shell thickness of about 2.5 nm and a void size of about 15 nm. Also, FIG. 16 indicates that the hollow nanoparticles have an average particle diameter of about 20 nm. The hollow nanoparticles were analyzed by XRD. The results are shown in FIG. 17. In a XRD pattern shown in FIG. 17, only peaks corresponding to Cu$_2$O crystals are observed. This reveals that the hollow nanoparticles are hollow nanoparticles of Cu$_2$O with high crystallinity. In addition, the particle diameter increases about 2 times in association with change from the solid nanoparticle to the hollow nanoparticles. This is possibly due to the fact that solid particles first aggregate together by heating to increase the particle size, and are then converted to hollow particles by oxidation with oxygen gas.

Example 8

(1) Production of Solid Nanoparticles

Figure 18:
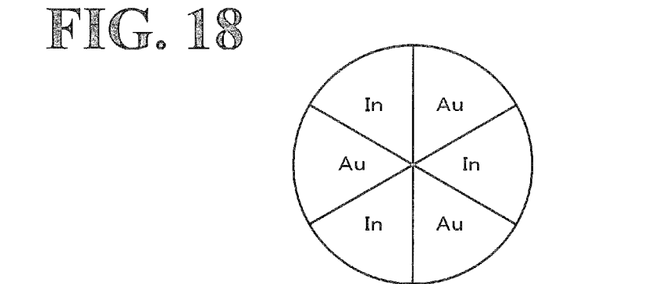
FIG. 18 is an explanatory view schematically illustrating a gold-indium alternating array plate.

On the same glass slide as in Example 1, 0.60 cm$^3$ of dried EMI-BF4 was uniformly placed. This glass slide was installed in the same deposition apparatus as in Example 1, and gold and indium were mounted as target materials at a position facing the EMI-BF4, followed by simultaneous sputter deposition of both metals (distance between the target and the ionic liquid: 2.0 cm, inside the deposition chamber: high-purity argon, pressure: 2.0 Pa, deposition current: 10 mA, reaction time: 10 minutes). After sputtering, an EMI-BF4 solution, i.e., an ionic liquid containing nanoparticles dispersed therein, was recovered from the surface of the glass slide. The target materials were used as a gold-indium alternating array plate (diameter 49 mm×thickness 0.5 mm) in which as shown in FIG. 18, the disk was divided into 6 equal parts by three straight lines passing through the center of the disk so that gold and indium were alternately arranged.

(2) Structural Analysis of Solid Nanoparticles

Figure 19:
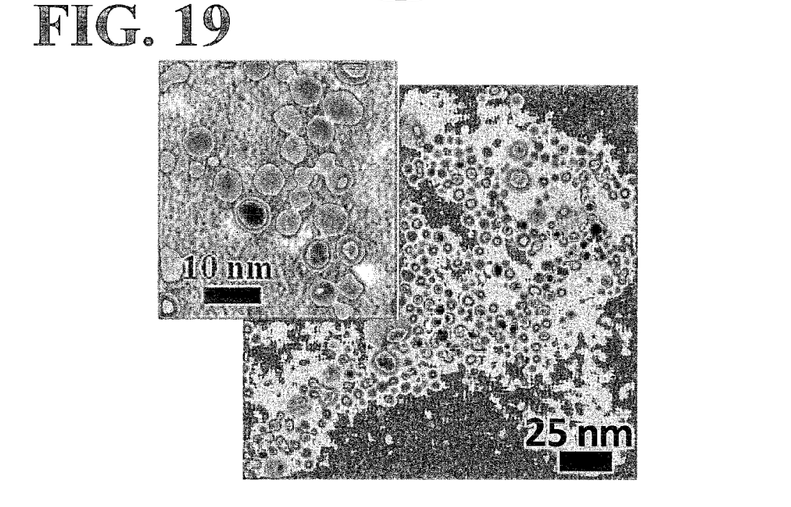
FIG. 19 is a photograph showing a TEM image of solid nanoparticles of Example 8.
Figure 20:
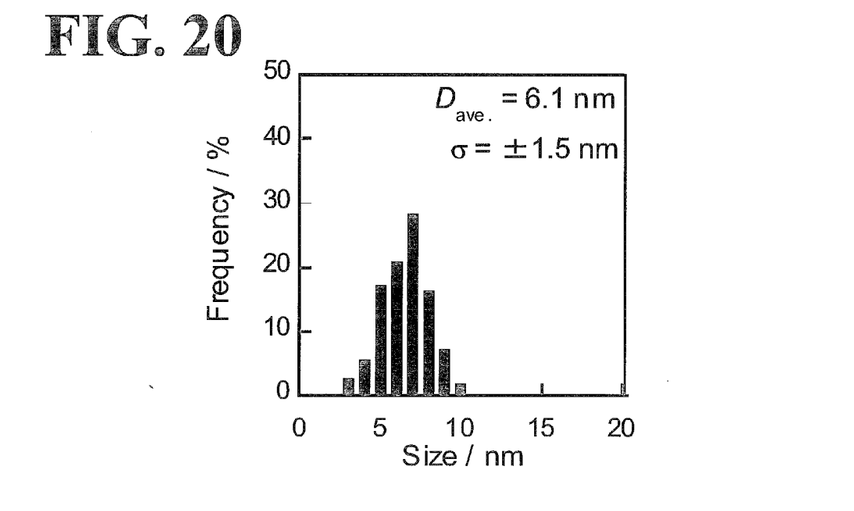
FIG. 20 is a graph showing a particle size distribution of solid nanoparticles of Example 8.

FIG. 19 shows a TEM image of the nanoparticles dispersed in the ionic liquid, and FIG. 20 shows a particle size distribution of the nanoparticles. In FIG. 19, the nanoparticles are shown as gray circles with a uniform color density. This reveals that the nanoparticles are solid nanoparticles. In addition, FIG. 20 indicates that the solid nanoparticles have an average particle diameter of about 6 nm.

(3) Production of Hollow Nanoparticles

In a test tube, 0.1 cm$^3$ of the ionic liquid containing the solid nanoparticles dispersed therein and produced as described above in (1) was placed and heated in air at 250° C. for 1 hour.

(4) Structural Analysis of Hollow Nanoparticles

Figure 21:
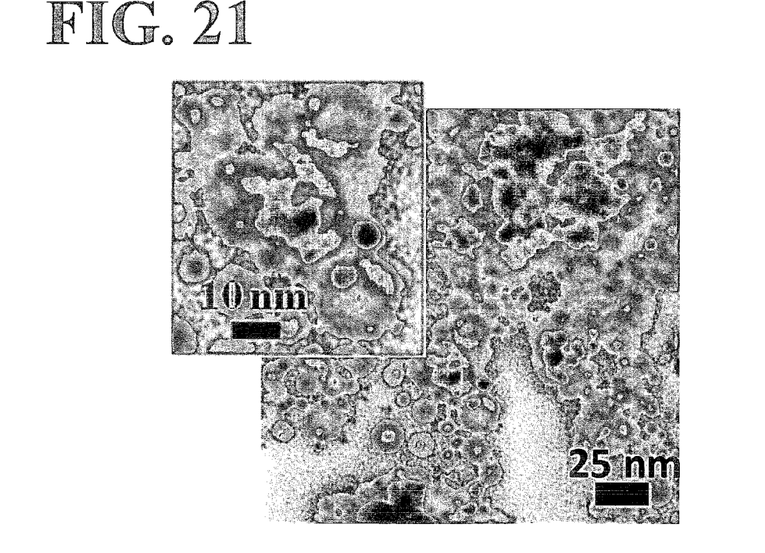
FIG. 21 is a photograph showing a TEM image of hollow nanoparticles of Example 8.
Figure 22:
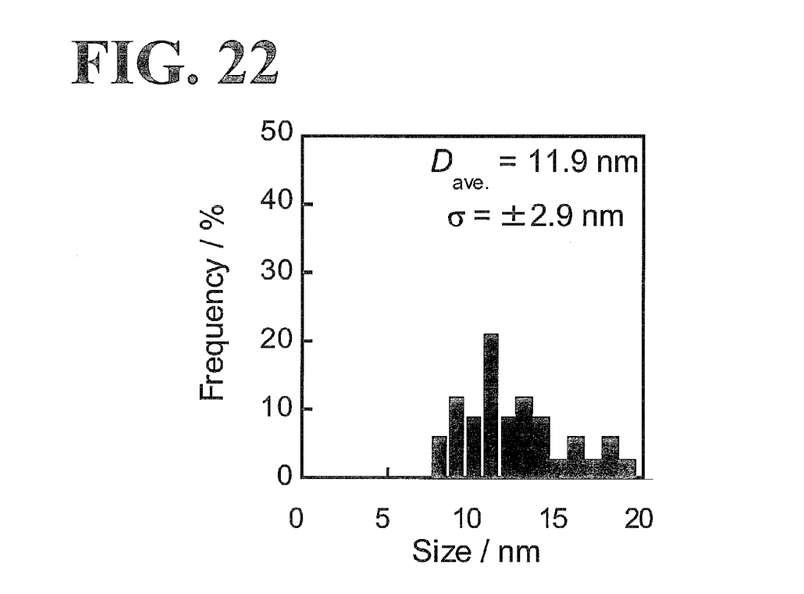
FIG. 22 is a graph showing a particle size distribution of hollow nanoparticles of Example 8.
Figure 23:
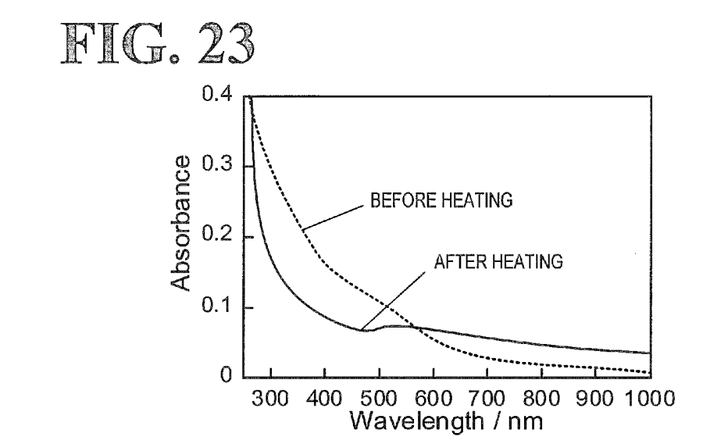
FIG. 23 is a graph showing absorption spectra of solid nanoparticles before heating and nanoparticles produced after heating in Example 8.
Figure 24:
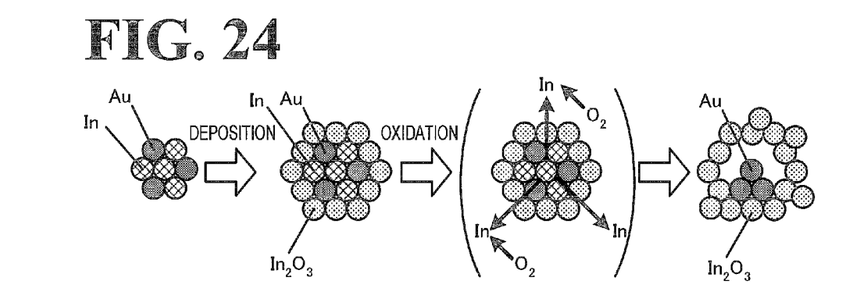
FIG. 24 is an explanatory view illustrating a production mechanism of hollow nanoparticles having a jingle-bell-shaped structure of Example 8.

FIG. 21 shows a TEM image of the nanoparticles dispersed in the ionic liquid after heating in air, and FIG. 22 shows a particle size distribution of the nanoparticles. The nanoparticles shown in FIG. 21 each have a circle shown in light gray and a ring shown in dark gray around the circle, and also have a smaller circle shown in darker gray inside the circle of light gray. Thus it is found that the nanoparticles are hollow nanoparticles having inner cavities and having a jingle-bell-shaped structure in which gold particles are present in the cavities. In addition, FIG. 21 indicates that the hollow nanoparticles have a void size of about 6 nm, and a particle size of inner gold particles of about 4 nm. Also, FIG. 22 indicates that the hollow nanoparticles have an average particle diameter of about 12 nm. Further, FIG. 23 is a graph showing absorption spectra before and after heating of the ionic liquid containing the solid nanoparticles dispersed therein, which were produced as described above in (1). After heating, the peak position is shifted to a longer wavelength of about 520 nm. This wavelength well coincides with the peak of surface plasmon resonance of Au nanoparticles. This suggests that when InAu alloy nanoparticles produced in the ionic liquid by simultaneous sputter deposition of indium and gold are heated in air, dealloying is caused by oxidation of only In of the nanoparticles, thereby producing Au nanoparticles. A conceivable production mechanism of the hollow nanoparticles having a jingle-bell-shaped structure is that as shown in FIG. 24, the solid nanoparticles each having the core portion composed of indium and gold and the shell portion composed of indium oxide are produced as described above in (1), and heating the solid nanoparticles in air causes reaction between oxygen gas in air and indium in the core portions through micro-spaces in the shell portions, producing indium oxide and cavities in the core portions leaving gold in the cavities because of its low oxidizability.

Example 9

Figure 25:
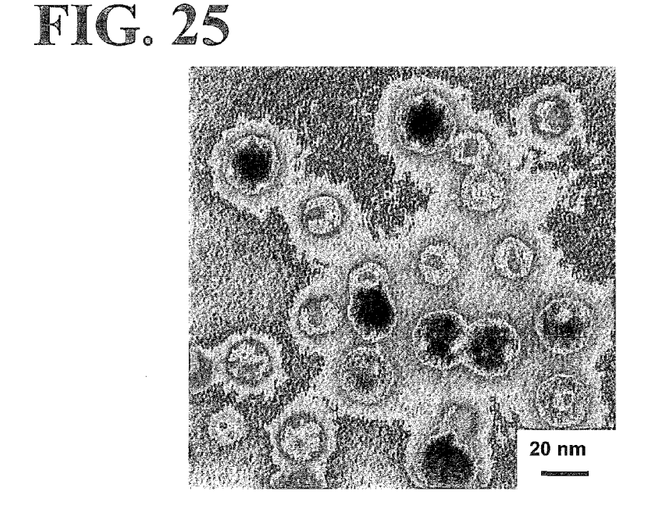
FIG. 25 is a photograph showing a TEM image of nanoparticles of Example 9.

On the same glass slide as in Example 1, 0.60 cm$^3$ of dried EMI-BF4 was uniformly placed. This glass slide was installed in the same deposition apparatus as in Example 1, and indium was mounted as a target material at a position facing the EMI-BF4, followed by sputter deposition (distance between the target and the ionic liquid: 2.0 cm, inside the deposition chamber: standard-purity argon (purity 99.99%), pressure: 1.5 Pa, deposition current: 20 mA, reaction time: 10 minutes). After sputtering, an EMI-BF4 solution, i.e., an ionic liquid containing nanoparticles dispersed therein, was recovered from the surface of the glass slide. FIG. 25 shows a TEM image of the nanoparticles dispersed in the ionic liquid. FIG. 25 indicates that as well as solid nanoparticles, hollow nanoparticles which are hollow inside are present. The number of the hollow nanoparticles is about 10% of the total. In addition, the nanoparticles have an average particle size of 18.3 nm and an inner core size of 8.7 nm. A conceivable production mechanism of such hollow nanoparticles is that solid nanoparticles are produced in an ionic liquid by sputter deposition, and indium metal cores of the particles are rapidly oxidized with oxygen gas present in a small amount in argon gas to produce the hollow nanoparticles.

The present invention is not limited to the above-described examples and can be, of course, carried out in various embodiments within the technical scope of the present invention.

This application claims priority to Japanese Patent Application No. 2009-258325 filed on Nov. 11, 2009, the entire contents of which are incorporated by reference herein.

Industrial Applicability

Hollow nanoparticles and a dispersion liquid thereof according to the present invention can be used as, for example, materials for a novel catalyst, an optoelectronic device, a biomolecular marker, etc.

The invention claimed is:

1. A method for producing hollow nanoparticles comprising:
    (a) depositing a first metal and a second metal which is less oxidizable than the first metal onto or into an ionic liquid, thereby forming solid nanoparticles of an alloy composed of the first and second metals dispersed in the ionic liquid; and
    (b) oxidizing the solid nanoparticles dispersed in the ionic liquid in a gas atmosphere containing oxidizing gas to produce hollow nanoparticles having a jingle-bell-shaped structure, whereby cavities are formed in core portions of the solid nanoparticles, and particles of the second metal remain in the cavities.

2. The method for producing hollow nanoparticles according to claim 1, wherein:
    the first and second metals are deposited onto or into the ionic liquid under reduced pressure in a rare gas-rich atmosphere, and
    the ionic liquid containing the solid nanoparticles dispersed therein is heated in the gas atmosphere containing oxygen gas.

3. The method for producing hollow nanoparticles according to claim 1, wherein the first metal is Al, Cr, Co, In, Cu, Sn, Ti, Ga, Mo, W, Si, Mg, V, Mn, Fe, Ni, Zn, Ge, Nb, or Ta, and the second metal is Au, Pt, Pd, Rh, Ru, or Ir.

* * * * *